US008829482B1

United States Patent
Gallo et al.

(10) Patent No.: US 8,829,482 B1
(45) Date of Patent: Sep. 9, 2014

(54) VARIABLE IMPEDANCE MEMORY DEVICE STRUCTURE AND METHOD OF MANUFACTURE INCLUDING PROGRAMMABLE IMPEDANCE MEMORY CELLS AND METHODS OF FORMING THE SAME

(75) Inventors: Antonio R. Gallo, San Jose, CA (US); Chakravarthy Gopalan, Santa Clara, CA (US); Yi Ma, Santa Clara, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 77 days.

(21) Appl. No.: 13/242,854

(22) Filed: Sep. 23, 2011

Related U.S. Application Data (60) Provisional application No. 61/385,761, filed on Sep. 23, 2010.

(51) Int. Cl.
*H01L 29/778* (2006.01)

(52) U.S. Cl.
USPC ........ 257/4; 257/412; 257/E29.092; 257/133; 257/134

(58) Field of Classification Search
USPC ................... 257/4, 2, 412, E29.092, 133, 134
See application file for complete search history.

(56) References Cited

U.S. PATENT DOCUMENTS

| | | | |
|---|---|---|---|
| 5,761,115 A | 6/1998 | Kozicki | |
| 6,291,082 B1 * | 9/2001 | Lopatin | 428/621 |
| 6,418,049 B1 | 7/2002 | Kozicki et al. | |
| 6,635,914 B2 | 10/2003 | Kozicki et al. | |
| 6,683,329 B2 * | 1/2004 | Moriya | 257/127 |
| 7,145,791 B2 | 12/2006 | Tsushima et al. | |
| 7,215,568 B2 | 5/2007 | Liaw et al. | |
| 7,397,688 B2 | 7/2008 | Tajiri | |
| 7,692,177 B2 * | 4/2010 | Moore et al. | 257/4 |
| 7,830,709 B2 | 11/2010 | Keller | |
| 7,928,419 B2 * | 4/2011 | Gopalakrishnan et al. | 257/2 |
| 7,957,182 B2 * | 6/2011 | Liu et al. | 365/171 |
| 7,977,662 B2 * | 7/2011 | Ryoo et al. | 257/5 |
| 8,084,760 B2 | 12/2011 | Lung et al. | |
| 8,309,166 B2 * | 11/2012 | Liu et al. | 427/125 |
| 8,426,839 B1 | 4/2013 | Ma et al. | |

* cited by examiner

*Primary Examiner* — Michael Shingleton (57) ABSTRACT

A programmable impedance memory device structure can include a multi-layer variable impedance memory element formed on a planar surface of a first barrier layer, the multi-layer variable impedance memory element comprising a plurality of layers substantially parallel to the planar surface, including a memory material layer in contact with the planar surface, the first barrier layer being formed above a first insulating layer; and a second barrier layer formed over the memory element having a top surface substantially parallel with the planar surface. The first and second barrier layers can have lower mobility rates for at least one element within the memory material layer than the first insulating layer, and the memory material layer can be programmable by application of an electrical field between at least two different impedance states.

27 Claims, 11 Drawing Sheets

FIG. 14A (BACKGROUND)

FIG. 14B (BACKGROUND)

FIG. 14C (BACKGROUND)

FIG. 14D (BACKGROUND)

FIG. 14E (BACKGROUND)

US 8,829,482 B1

VARIABLE IMPEDANCE MEMORY DEVICE STRUCTURE AND METHOD OF MANUFACTURE INCLUDING PROGRAMMABLE IMPEDANCE MEMORY CELLS AND METHODS OF FORMING THE SAME

This application claims the benefit of U.S. Provisional Patent Application Ser. No. 61/385,761, filed on Sep. 23, 2010, the contents of which are incorporated by reference herein.

TECHNICAL FIELD

The present invention relates generally to memory elements for storing data in an integrated circuit device, and more particularly to variable impedance elements, such as programmable metallization cells (PMCs).

BACKGROUND ART

FIGS. 14A to 14E show a conventional method of forming a programmable impedance cell.

Figure 14A:
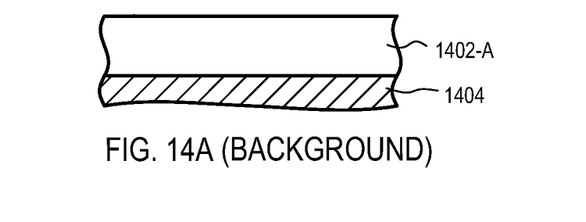
FIGS. 14A to 14E are side cross sectional views showing a conventional method of forming a programmable impedance memory cell.

FIG. 14A shows the formation of a first ion conductor layer 1402-A on a bottom electrode layer 1404.

Figure 14B:
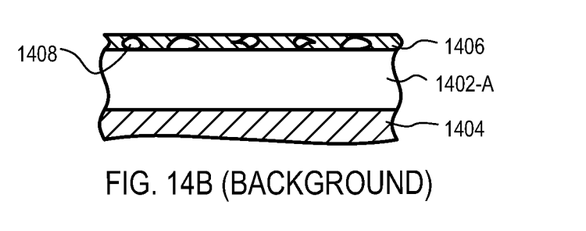

FIG. 14B shows the formation of an active metal layer 1406 on first ion conductor layer 1402-A. Active metal layer 1406 may be formed in the presence of ambient air. Consequently, reaction products may be created due to components of such an ambient air environment. For example, water vapor or oxygen (or other species) within the air may create undesirable, or uncontrolled reaction products (one shown as 1408) within active metal layer 1406 or ion conductor layer 1402-A.

Figure 14C:
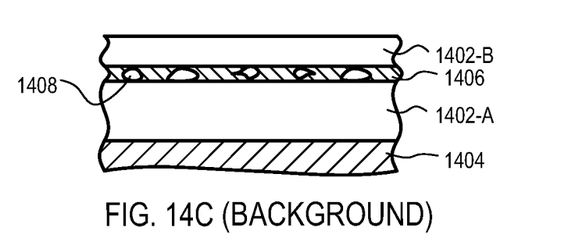

FIG. 14C shows the formation of a second ion conductor layer 1402-B on an active metal layer 1406.

Figure 14D:
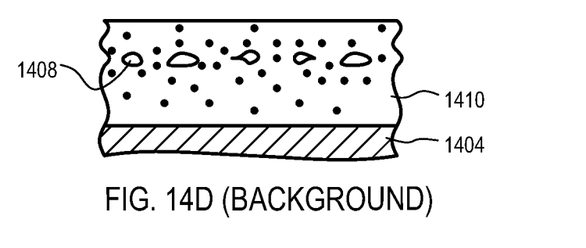

FIG. 14D shows the incorporation of active metal layer 1406 into ion conductor layers 1402-A and 1402-B. Reaction products (e.g., 1408) may remain within a resulting ion conductor layer 1410.

Figure 14E:
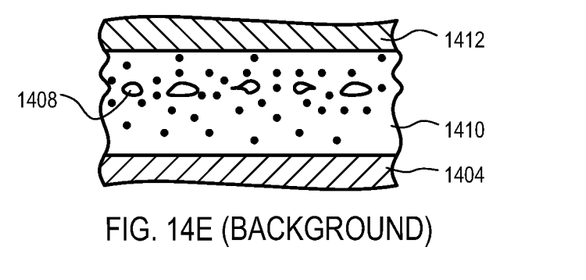

FIG. 14E shows the formation of a top electrode 1412 on ion conductor layer 1410.

Uncontrolled or undesirable products (e.g., 1408) may lead to inadequate or undesirably variable programmable resistance responses for ion conductor layer 1410. Alternatively, such products (e.g., 1408) may affect the incorporation of active metal layer 1406 into ion conductor layers (1402-A and 1402-B) in an uncontrolled or unpredictable sense.

DESCRIPTION OF EMBODIMENTS

Embodiments of the invention show memory device structures and manufacturing methods having a programmable impedance layer that is substantially planar, and hence may be more reliable than memory structures formed on irregular features, in particular those that may introduce a "step" into such layers.

FIGS. 1A to 1E are a series of cross sectional views showing a method of fabricating a memory device 100, as well as a resulting memory cell structure, according to one embodiment.

Figure 1A:
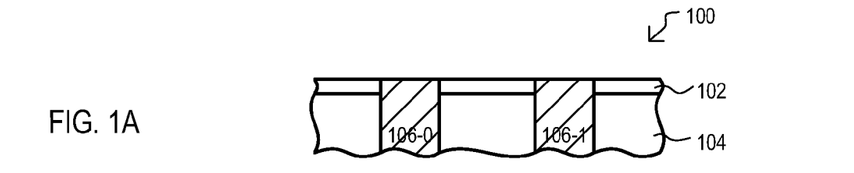
FIGS. 1A to 1E are side cross sectional views showing a method of fabricating a memory device, and a memory device structure according to an embodiment.

FIG. 1A shows a memory structure 100 having a first barrier layer 102 formed on a first insulating layer 104. Conductive elements 106-0 and 106-1 may extend through first insulating layer 104 and first barrier layer 102. Conductive elements (106-0/1) may have top surfaces that are substantially coplanar with a top surface of first barrier layer 102. Such a structure may present a substantially planar top surface.

Figure 1B:
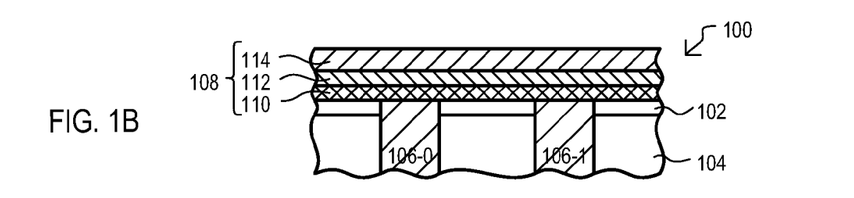

FIG. 1B shows the formation of memory structure layers 108 on a top surface of first barrier layer 102. Memory structure layers 108 may be layers that are parallel to a top surface of first barrier layer 102. In the particular embodiment of FIG. 1B, memory structure layers 108 may include memory layers 110 and 112, and a conductive barrier layer 114.

Memory layers 110 and 112 may form a structure that may be programmable between two or more impedance states in response to an electric field. Memory layer 110 may contact one or more underlying conductive elements (in the embodiment shown, conductive elements 106-0 and 106-1). Memory layer 112 may be a conductive layer.

Conductive barrier layer 114 may serve as a conductive connection point for an overlying interconnect structure (not shown), and serve as a physical barrier to prevent such an overlying interconnect structure from extending into memory layers 112 or 110. It is noted that the planarity of memory layers 110 and 112 may allow such a layer to be thinner than approaches in which such layers are not planar, in particular those having a step in height that requires step coverage. Ensuring adequate step coverage may require a greater film thickness than a planar structure.

Further, a first barrier layer 102 may serve as a barrier to prevent one or more elements within memory structure layers 108 from propagating downward through first insulating layer 104 and adversely affecting other parts of a corresponding device, such as transistors (not shown).

Figure 1C:
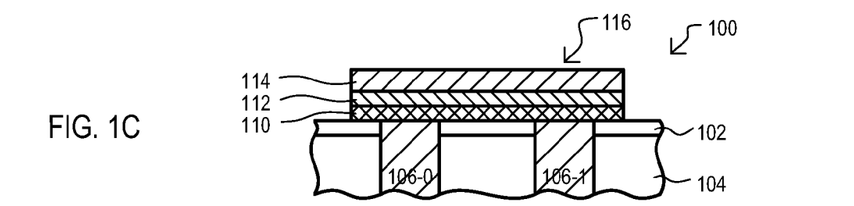

Referring to FIG. 1C, memory structure layers 108 may be patterned to create a memory cell structure 116 composed of memory layers 110 and 112, and conductive barrier layer 114. In a resulting memory cell structure 116, layers 110, 112, and 114 may be substantially planar and substantially parallel with one another, as well as parallel to a top surface of first barrier layer 102. In such an arrangement, an underlying conductive element 106-0/1 may serve as a first electrode for a programmable memory element, while memory layer 112 and conductive barrier layer 114 may serve as a second electrode for the programmable memory element. It is understood that such a patterning step may create multiple such memory structures adjacent to one another.

Figure 1D:
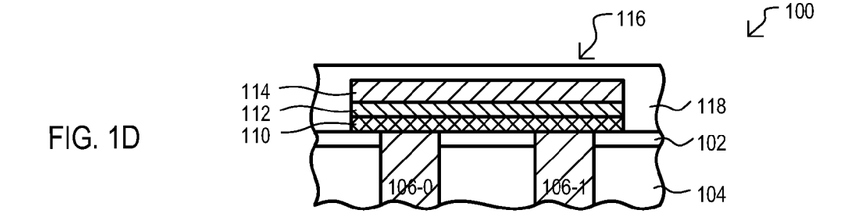

Referring to FIG. 1D, a second barrier layer 118 may be formed over memory structure 116. It is understood that second barrier layer may extend between memory structures 116 and any adjacent memory structures in a lateral direction (not shown). Like first barrier layer 102, second barrier layer 118 may serve as a barrier to prevent one or more elements of memory structure layers 108 from propagating upward through overlying insulating layers (an example of which is shown as 120 in FIG. 1E) and adversely affecting other parts of a corresponding device.

Figure 1E:
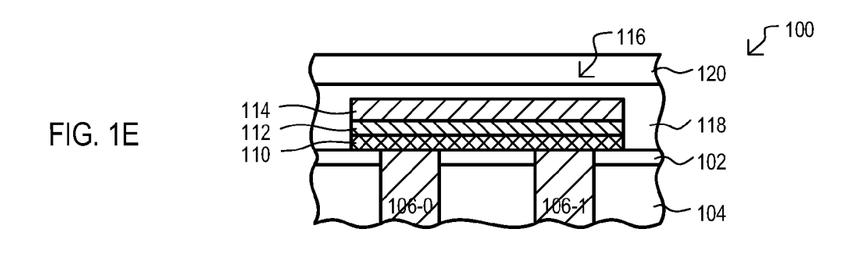

Referring to FIG. 1E, a second insulating layer 120 may be formed over second barrier layer 118.

In this way, a memory cell structure can be formed of substantially planar layers with barrier layers formed below and or above that prevent elements from propagating from the memory cell structure to other regions of a device.

FIGS. 2A to 2I are a series of cross sectional views showing a method of fabricating a memory device 200, as well as a resulting memory cell structure according to another embodiment.

Figure 2A:
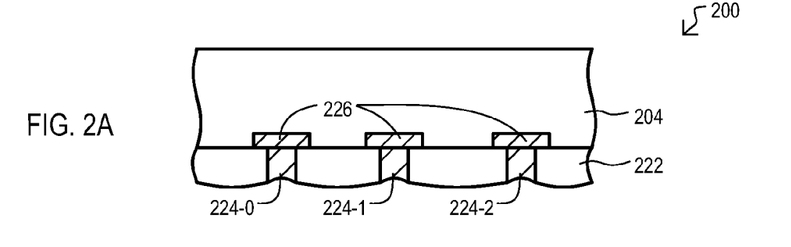
FIGS. 2A to 2I are side cross sectional views showing a method of fabricating a memory device, and a memory device structure according to another embodiment.

FIG. 2A shows a memory device 200 that includes a first insulating layer 204 formed on a lower insulating layer 222. Conductive contacts 224-0 to 224-2 may extend through lower insulating layer 222 and have a conductive connection with a lower interconnect pattern 226. In one particular embodiment, contacts (224-0 to 224-2) may connect to active devices (e.g., transistors), not shown in FIGS. 2A to 2I.

Contacts 224-0 to 224-2 may be formed from a metal, combination of metals, a metal alloy, a semiconductor material, or combinations thereof, suitable for a desired resistance. In one particular embodiment, contacts (224-0 to 224-2) may include tungsten (W). Lower insulating layer 222 may be formed from an insulating material, which in one embodiment may include undoped silicon dioxide. Lower interconnect pattern 226 may be formed from a metal, combination of metals, alloy, semiconductor, or combinations thereof, suitable for the application of the corresponding circuit. In one particular embodiment, a lower interconnect pattern 226 may be formed from aluminum and/or copper. First insulating layer 204 may be formed from an insulating material, and in one embodiment may include undoped silicon dioxide.

Figure 2B:
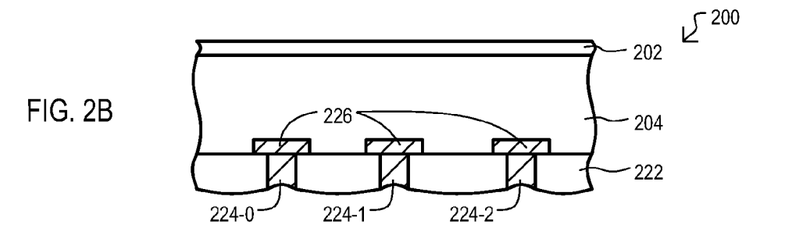

Referring to FIG. 2B, a first barrier layer 202 may be formed on first insulating layer 204 and include a planar top surface. A first barrier layer 202 may serve as a barrier to the travel of one or more elements contained within a subsequently formed memory structure. In one particular embodiment, a first barrier layer 202 may include silicon nitride.

Figure 2C:
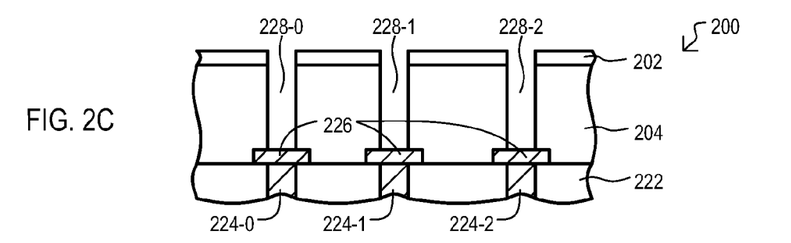

Referring to FIG. 2C, lower openings 228-0 to 228-2 may be formed through first insulating layer 204 and first barrier layer 202. Lower openings (228-0 to 228-2) may expose lower interconnect pattern 226. In one particular embodiment, such a step may include forming an etch mask from a photoresist or the like, and reactive ion etching to create lower openings (228-0 to 228-2).

Figure 2D:
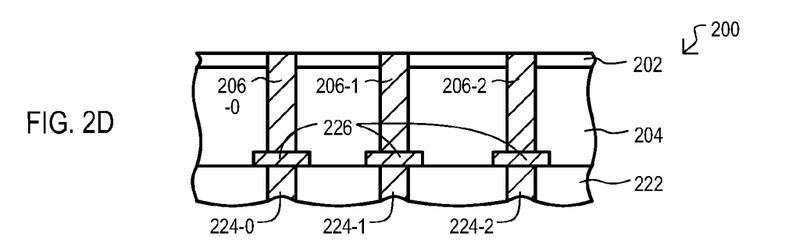

Referring to FIG. 2D, conductive elements 206-0 to 206-2 may be formed within lower openings 228-0 to 228-2, respectively. A resulting top surface may be planarized so that a top surface of conductive elements (206-0 to 206-2) may be substantially coplanar with a top surface of first barrier layer 202. In one particular embodiment, conductive elements (206-0 to 206-2) may include tungsten "plugs".

Figure 2E:
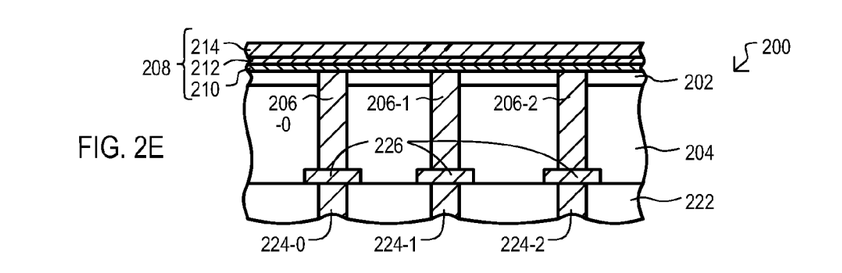

Referring to FIG. 2E, memory structure layers 208 may be formed from multiple parallel layers, and may include a layer formed over and in contact with a top surface of first barrier layer 202 and conductive elements (206-0 to 206-2). In the embodiment of FIG. 2E, memory structure layers 208 may include an ion conductor layer 210, an ion source layer 212, and a conductive barrier layer 214. An ion conductor layer 210 may provide an impedance (e.g., resistance and/or capacitance) that may be caused to vary by application of an electric field. Such an impedance variation may be substantially nonvolatile, or may have a limited duration.

In one very particular embodiment, an ion conductor layer 210 may include a chalcogenide or transition metal oxide. In a very particular embodiment, an ion conductor 210 can include germanium disulfide ($GeS_2$). An ion source layer 212 can include any of silver (Ag) or copper (Cu), and conductive barrier layer 214 may include titanium nitride (TiN).

Figure 2F:
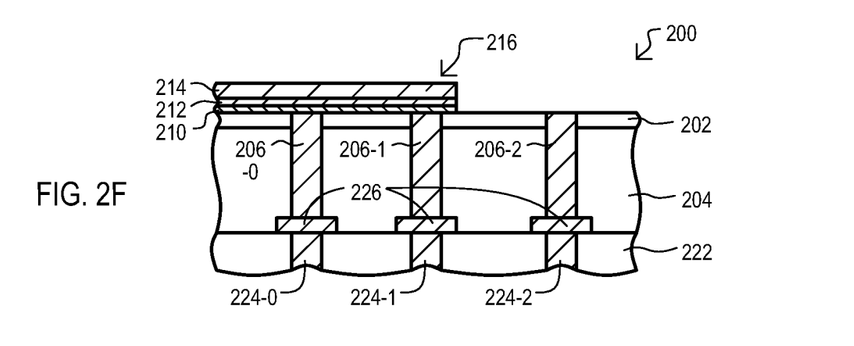

Referring to FIG. 2F, memory structure layers 208 may be patterned to create a memory cell structure 216. In one particular embodiment, such a step may include forming an etch mask from a photoresist, or the like, and reactive ion etching to expose portions of the top surface of first barrier layer 202 and/or selected of conductive elements (206-0 to 206-2). In the example of FIG. 2F, such a patterning step may expose conductive element 206-2, while conductive elements 206-0 and 206-1 may remain in contact with the resulting memory cell structure 216.

Figure 2G:
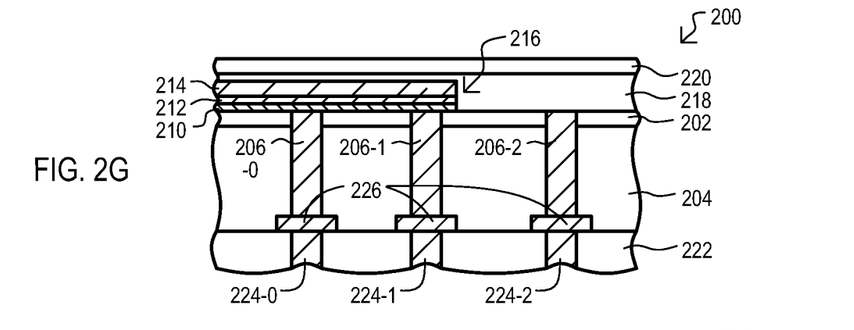

Referring to FIG. 2G, a second barrier layer 218 may be formed over and on the sides of memory structure 216. Second barrier layer 218, like first barrier layer 202, may serve as a barrier to the travel of one or more elements contained within a subsequently formed memory cell structure. In one particular embodiment, a second barrier layer 218 may include silicon nitride.

A second insulating layer 220 may be formed over second barrier layer 218. A second insulating layer 220 may be different from a second barrier layer 218, and in one particular embodiment may include silicon dioxide formed by the decomposition of tetraethylorthosilicate (TEOS).

Figure 2H:
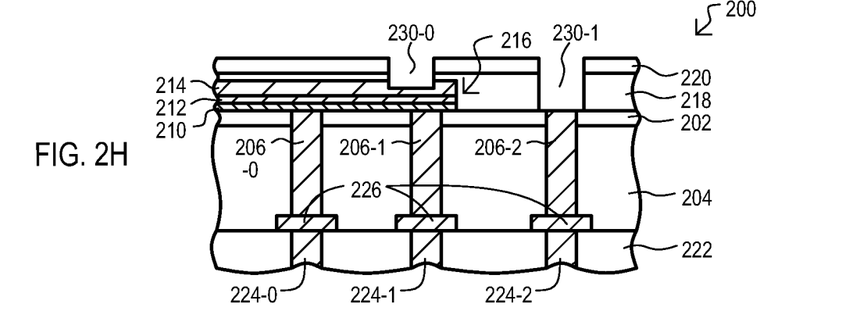

Referring to FIG. 2H, upper openings 230-0 and 230-1 may be formed through second barrier layer 218 and second insulating layer 220 to expose a memory cell structure 216. In the example of FIG. 2H, upper opening 230-0 may expose conductive barrier layer 214 of memory cell structure 216, and upper opening 230-1 may expose conductive element 206-2. In one particular embodiment, such a step may include forming an etch mask from a photoresist or the like, and reactive ion etching to create upper openings (230-0 and 230-1).

Figure 2I:
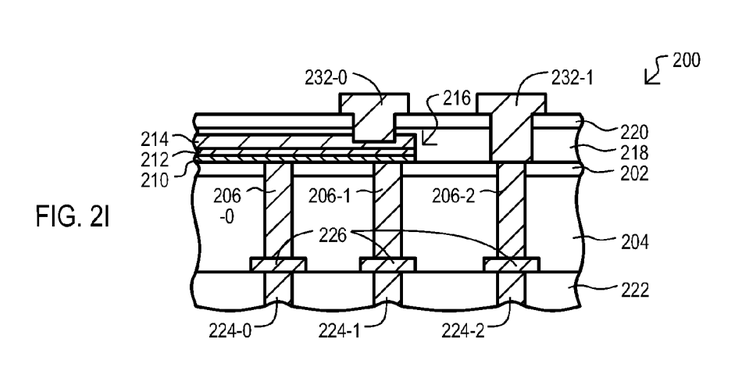

Referring to FIG. 2I, an upper interconnect layer 232-1/2 may be formed over second insulating layer 220 and extend into upper openings (230-0 and 230-1). Such a step may include depositing a metallization layer, and patterning such a layer to create upper interconnect layer 232-1/2. In one very particular embodiment, an upper interconnect layer 232-1/2 may include copper.

It is noted that conductive barrier layer 214 may serve as barrier layer to prevent upper interconnect layer 232-0/1 from extending into ion source layer 212 or ion conductor layer 210. In addition or alternatively, conductive barrier layer 214 may provide better adhesion for upper connect layer 232-1/2 than ion source layer 212.

In one very particular embodiment, an ion conductor layer 210 may include Ag or Cu, and conductive barrier layer 214 may include TiN. A first barrier layer 202 may include silicon nitride, but in alternate embodiments, may include silicon oxynitride. A first insulating layer 204 may include undoped silicon dioxide, or in other embodiments, a doped silicon dioxide, including but not limited to phosphosilicate glass (PSG) or borophosphosilicate glass (BPSG). A second barrier layer 218 may include silicon nitride, but in alternate embodiments may include silicon oxynitride. A second insulating layer 220 may include undoped silicon dioxide, or in other embodiments, a doped silicon dioxide, including but not limited to PSG or BPSG.

Figure 3:
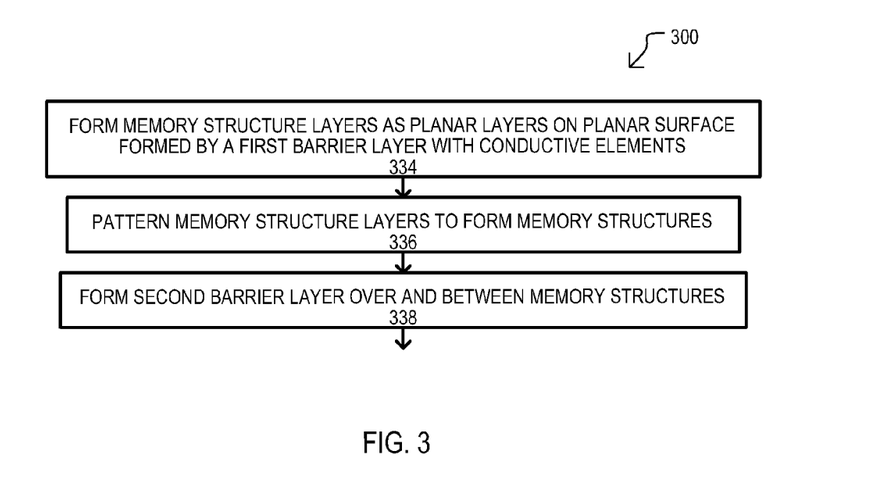
FIG. 3 is a flow diagram of a method of forming a memory device according to an embodiment.

FIG. 3 shows a method 300 according to one embodiment in a flow diagram.

A method 300 may include forming memory structure layers as planar layers on a planar surface formed by a first barrier layer with conductive elements (step 334). Such an action may form layers that can create a programmable impedance structure, where such layers are all planar. Such planar structures may be thinner than other approaches that result in such layers being formed over one or more steps. In addition, a first barrier layer may protect underlying layers from undesirable elements within memory structure layers.

A method 300 may further include patterning memory structure layers to form memory structures (step 336). Such an action may create memory structures each formed from a same set of planar layers. Consequently, top surfaces of each memory structure may be coplanar with one another. This may provide an advantageously uniform surface by which to interconnect the memory structures with other circuit sections, such as when a method 300 is integrated within a larger integrated circuit manufacturing process. Such a uniformly flat surface may allow for more uniform and/or predictable results for patterning steps (e.g., photolithography) on layers formed over and/or in contact with the memory structures.

A method 300 may also include forming a second barrier layer over and between memory structures (step 338). Such an action may result in memory structures being contained between a first barrier layer formed below, and an upper barrier layer formed above. Such an arrangement may prevent undesirable elements within memory structures from propagating to other locations of a device.

Figure 4:
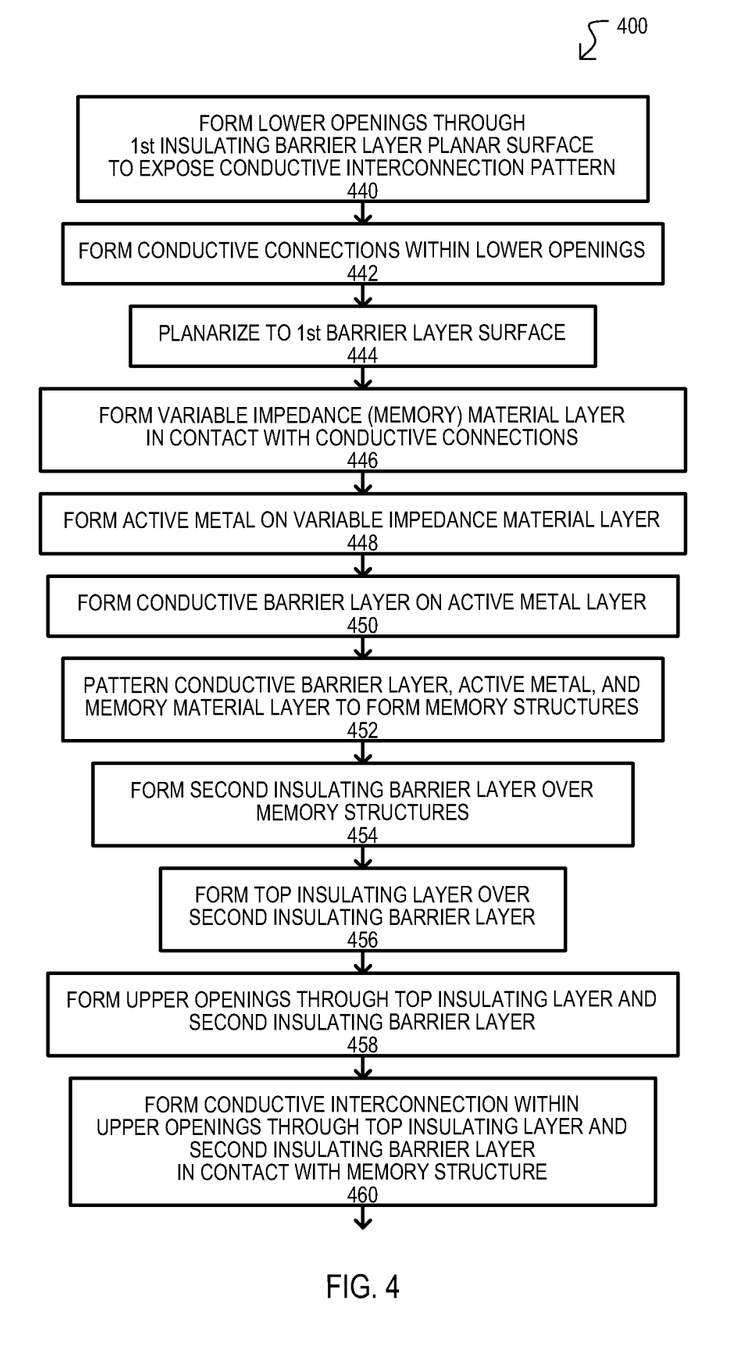
FIG. 4 is a flow diagram of a method of forming a memory device according to a further embodiment.

FIG. 4 shows a method 400 according to another embodiment in a flow diagram.

A method 400 may include forming lower openings through a first insulating barrier layer planar surface to expose a conductive interconnection pattern (step 440). Conductive connections may then be formed within the lower openings (step 442). A method 400 may planarize to a first barrier layer surface (step 444). Such an action may create a planar surface that includes conductive connections. Such conductive connection may enable electrical connections between the conductive interconnection pattern and subsequently formed memory materials.

A variable impedance (memory) material layer may be formed that is in contact with conductive connection (step 446). Such a memory material layer may include a material that may vary its impedance in response to the application of a voltage or current (i.e., may be programmed/erased). In such an arrangement, a program and/or erase voltage may be established, at least in part, through lower conductive connections.

An active metal may be formed on the memory material (step 448). In one particular embodiment, a memory material may be an ion conductor, and an active metal may be an ion source for such an ion conductor.

A conductive barrier layer may then be formed on the active metal (step 450). Such an action may create a three layer structure (memory material, active metal, conductive barrier), with all such layers being planar and parallel to one another.

A method 400 may then pattern the conductive barrier layer, active metal and memory material layer to form memory structures (step 452). In one particular embodiment, such a step may form a number or programmable metallization cell (PMC) memory cells. Each such structure may include a resistive memory material formed by the memory material between a first electrode that includes conductive connections to a lower interconnection pattern, and a second electrode that includes portions of the active metal.

A second insulating barrier layer may be formed over memory structures (step 454). A top insulating layer may be formed over the second barrier layer (step 456). Such an action may create insulating layers over the memory structures that have a substantially planar top surface. A substantially planar top surface may allow for more reliable patterning steps on such a surface.

Upper openings may be formed through the top insulating layer and second insulating barrier layer (step 458). Such a step may include photolithographic steps that may create an etch mask on a substantially planar top surface of top insulating layer.

A method 400 may also include forming a conductive interconnection within upper openings through top insulating layer and second insulating barrier layer and in contact with memory structures (step 460). Such an action may provide electrical connections to top surfaces of memory structures.

While embodiments above have shown planar memory device structures having a programmable (i.e., variable) impedance layer, other embodiments can include variable impedance layers, and methods of forming such layers. Embodiments shown below can include programmable impedance memory cells and methods of forming such cells. In particular embodiments, such memory cells may include a variable impedance layer formed between electrodes, where the variable impedance layer includes a matrix material having an active material formed therein. Electrical properties of such a variable impedance layer may be altered by incorporating the active material under particular conditions including: a high vacuum, changing a substrate temperature, electrically biasing a substrate, or introducing predetermined reactive materials as the matrix or active materials are formed.

Figure 5:
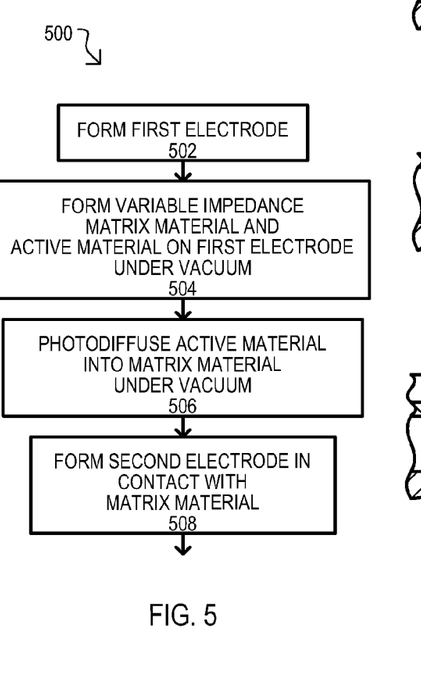
FIG. 5 is a flow diagram of a method of forming a memory cell with deposition and incorporation of an active material occurring under a vacuum environment, according to an embodiment.
Figure 6A:
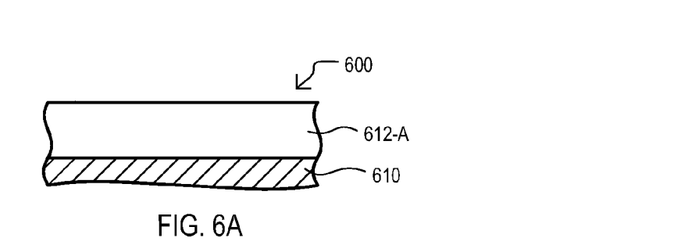
FIGS. 6A to 6E are side cross sectional views showing one example of a method like that of FIG. 5.
Figure 6B:
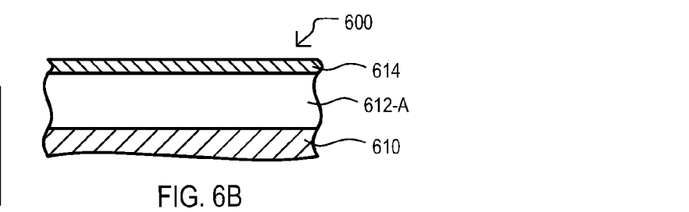
Figure 6C:
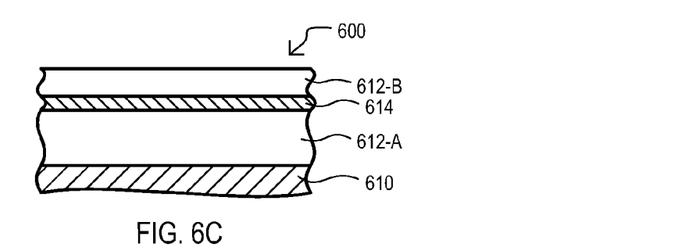
Figure 6D:
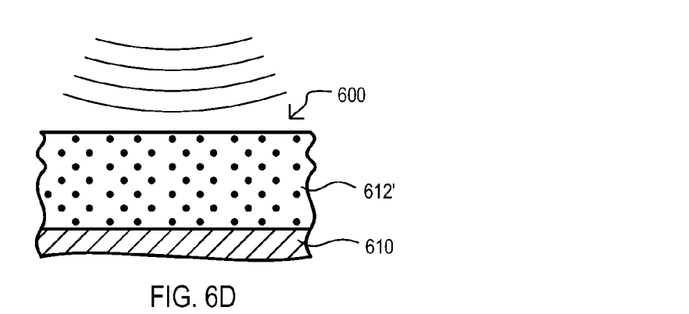
Figure 6E:
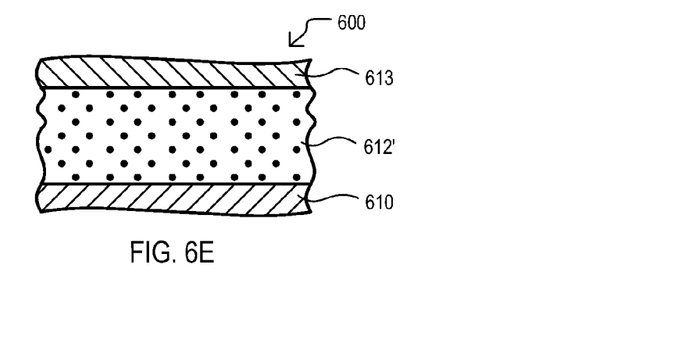

FIGS. 5 to 6E show examples of a method 500 and a memory cell structure 600 according to embodiments.

A method 500 can include forming a first electrode (step 502). Such an action can include forming a conductive material and patterning such a material. Such a patterning can occur after the formation of other layers. In some embodiments, a first electrode can be an "active" electrode, formed from a material that can be incorporated into a subsequently formed variable impedance layer to alter an impedance response of such a material. In other embodiments, a first electrode can be an "indifferent" electrode, formed from a material that cannot be incorporated into a variable impedance layer.

A method 500 can also include forming a variable impedance matrix material and an active material on a first electrode under a vacuum (step 504). Such a step can include having a substrate with the first electrode layer in a vacuum, and then forming a matrix material and active layer material without breaking the vacuum environment. In very particular embodiments, a vacuum can be less than 600 Torr, preferably less than 50 Torr, even more preferably less than $10^{-1}$ Torr.

FIGS. 6A to 6C show one very particular example of a structure following steps like that of step 504. FIG. 6A shows a first electrode layer 610 having a first matrix layer 612-A formed thereon. In one embodiment, a first matrix layer 612-A can be deposited under a vacuum.

FIG. 6B shows an active material layer 614 formed on a first matrix layer 612-A. An active material layer 614 can include a material that can be incorporated into first matrix layer 612-A to vary programmable impedance properties of such a material. Active material layer 614 can be formed under vacuum, and so may not expose such a layer to uncontrolled potentially reactive materials, such as those that can be present in an ambient air atmosphere.

FIG. 6C shows a second matrix layer 612-B on active material layer 614. A second matrix layer 612-B can be formed from a same material as first matrix layer 612-A. In the embodiment shown, a second matrix layer 612-B can be deposited under a vacuum.

Method 500 can also include photo-diffusing active material into a matrix material under a vacuum (step 506). Such a step can include applying a light (in visible or non-visible spectrums) of suitable frequency and intensity to cause the incorporation of the active material layer 614 into matrix layers 612-A and 612-B. Such an action can help establish the programmable properties of a variable impedance layer. Application of such light can occur under a vacuum. In very particular embodiments, a vacuum can be less than 600 Torr, preferably less than 50 Torr, even more preferably less than $10^{-1}$ Torr.

FIG. 6D shows a memory cell structure 600 following a step like that of 506. By application of light, active material (represented by dots) from layer 614 can be incorporated into matrix layers 612-A and 612-B to form a variable impedance layer 612'. A variable impedance layer 612' can have an impedance that is programmable according to the application of an electric field.

Method 500 can also include forming a second electrode in contact with the matrix material (step 508). Such a step can include forming a conductive material and patterning such a material. Such a patterning can occur after the formation of other layers. Like a first electrode, a second electrode can be an active electrode (in the event the first electrode layer serves as an indifferent electrode), or an indifferent electrode (in the event the first electrode layer serves as an active electrode).

FIG. 6E shows one example of a memory cell 600 following a step 508. A second electrode layer 613 can be formed on variable impedance layer 612'.

In a very particular embodiment, matrix layers 612-A and 612-B can include a chalcogenide and/or a transition metal oxide. In particular embodiments, matrix layers (612-A and 612-B) can include $GeS_2$. In some embodiments, an active material layer 614 can include a silver and/or copper.

In this way, a memory cell can have a variable impedance layer formed in a vacuum, and thus such a layer may not be exposed to ambient air and potentially reactive materials within the ambient air.

Figure 7:
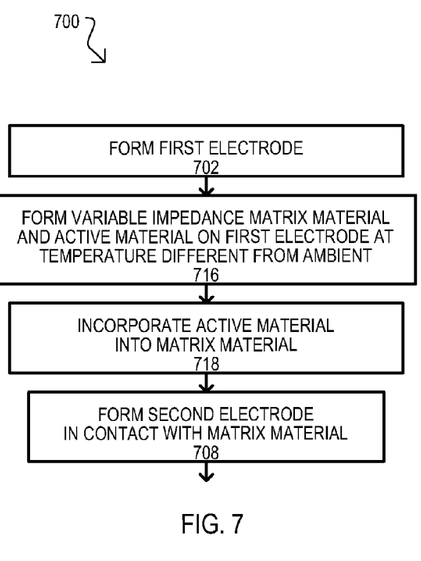
FIG. 7 is a flow diagram of a method of forming a memory cell with deposition of an active material occurring under a temperature different than ambient, according to an embodiment.
Figure 8A:
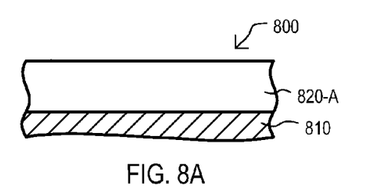
FIGS. 8A to 8E are side cross sectional views showing one example of a method like that of FIG. 7.
Figure 8B:
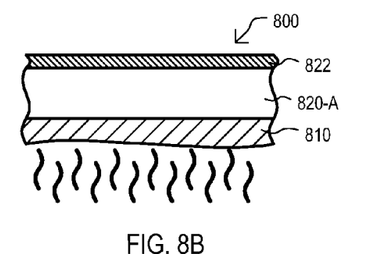
Figure 8C:
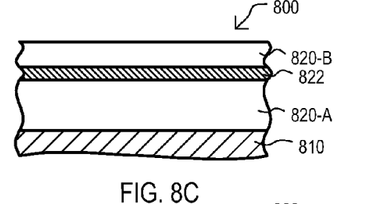
Figure 8D:
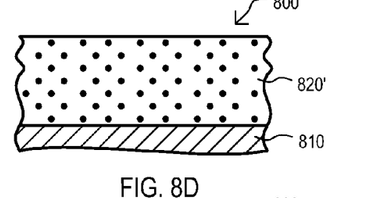
Figure 8E:
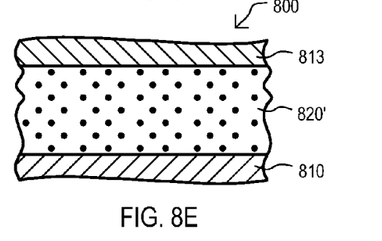

FIGS. 7 to 8E show examples of a method 700 and a memory cell structure 800 according to additional embodiments.

A method 700 can include forming a first electrode (step 702). Such a step can occur in the manner described for 502 in FIG. 5, or equivalents.

A method 700 can also include forming a variable impedance matrix material and an active material on a first electrode at a temperature different from ambient (step 716). Such a step can include cooling, or alternatively, heating a substrate with the first electrode layer, and then forming a matrix material or active layer material at such a changed temperature.

FIGS. 8A to 8C show one very particular example of a structure following steps like that of step 716. FIG. 8A shows a first electrode layer 810 having a first matrix layer 820-A formed thereon. In the embodiment shown, a first matrix layer 820-A can be deposited at a changed temperature. However, in an alternate embodiment, such a layer can be formed at an ambient temperature.

FIG. 8B shows an active material layer 822 formed on a first matrix layer 820-A. An active material layer 822 can include a material that can be incorporated into first matrix layer 820-A to vary programmable impedance properties of such a material. Active material layer 822 can be formed at a changed temperature to alter properties of such a material. In one very particular embodiment, an active material layer 822 can be formed at a lower than ambient temperature to produce a layer having smaller grain sizes than at a higher temperature ambient. Conversely, in an alternate embodiment, an active material layer 822 can be formed at a temperature to modify grain size and structure in such an active material layer. Such variations in grain size and structure can affect how the resulting active material is incorporated into a corresponding matrix material.

FIG. 8C shows a second matrix layer 820-B on active material layer 822. A second matrix layer 820-B can be formed from a same material as first matrix layer 820-A. In the embodiment shown, a second matrix layer 820-B can be deposited at the changed temperature. However, in an alternate embodiment, such a layer can be formed at an ambient temperature.

Method 700 can also include incorporating an active material into a matrix material (step 718). Such a step can include applying a light as in the photo-diffusing step 506 of FIG. 5, or equivalent. In addition or alternatively, such a step can include applying heat suitable to cause the incorporation of the active material layer 822 into matrix layers 820-A and 820-B.

FIG. 8D shows a memory cell structure 800 following a step like that of 718. Active material (represented by dots) from layer 822 can be incorporated into matrix layers 820-A and 820-B to form a variable impedance layer 820'. A variable impedance layer 820' can have an impedance that is programmable according to the application of an electric field.

Method 700 can also include forming a second electrode in contact with the matrix material (step 708). Such a step can occur in the manner described for 508 in FIG. 5, or equivalents.

As in the case of the embodiment shown in FIGS. 5 to 6E, in a particular embodiments, matrix layers 812-A and 812-B can include a chalcogenide and/or a transition metal oxide, in a particular $GeS_2$. Further, in some embodiments, an active material layer 822 can include a silver and/or copper.

In this way, a memory cell can have a variable impedance layer created by forming an active material layer at a lowered or elevated temperature. Such changes in temperature can change grain sizes in such an active area, and thus vary how such the active material is incorporated in to a corresponding matrix material layer.

Figure 9:
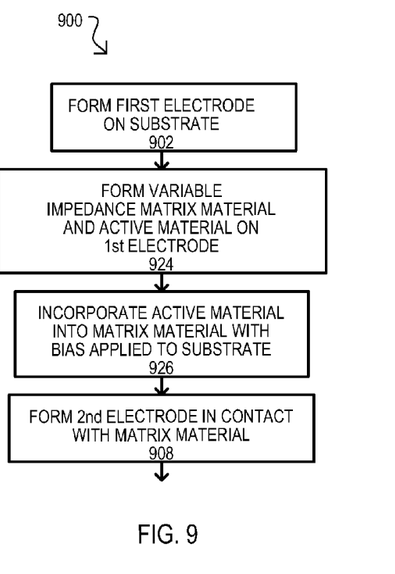
FIG. 9 is a flow diagram of a method of forming a memory cell with deposition and incorporation of an active material occurring under an electrical bias, according to an embodiment.
Figure 10A:
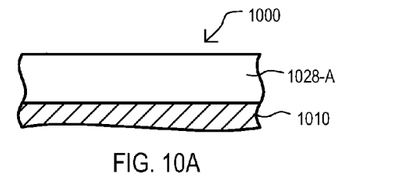
FIGS. 10A to 10E are side cross sectional views showing one example of a method like that of FIG. 9.
Figure 10B:
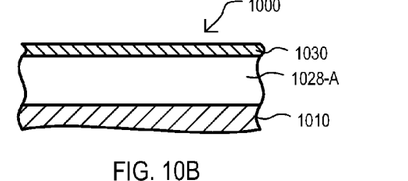
Figure 10C:
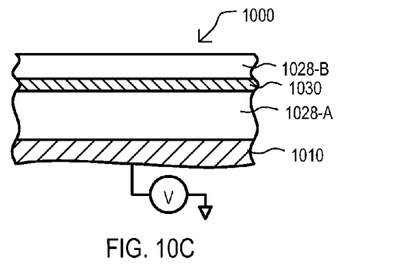
Figure 10D:
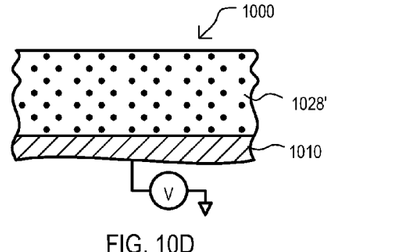
Figure 10E:
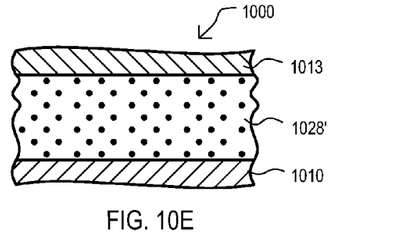

FIGS. 9 to 10E show examples of a method 900 and a memory cell structure 1000 according to additional embodiments.

A method 900 can include forming a first electrode (step 902). Such a step can occur in the manner described for 502 in FIG. 5, or equivalents.

A method 900 can also include forming a variable impedance matrix material and an active material on a first electrode (step 924).

FIGS. 10A to 10C show one very particular example of a structure following steps like that of step 924. FIG. 10A shows a first electrode layer 1010 having a first matrix layer 1028-A formed thereon. FIG. 10B shows an active material layer 1030 formed on a first matrix layer 1028-A. An active material layer 1030 can include a material that can be incorporated into first matrix layer 1028-A to vary programmable impedance properties of such a material. FIG. 10C shows a second matrix layer 1028-B on active material layer 1030. A second matrix layer 1028-B can be formed from a same material as first matrix layer 1028-A.

Method 900 can also include incorporating an active material into a matrix material with a bias applied to a substrate (step 926). Such a step can include providing appropriate energy to cause active material layer to be incorporated into matrix layers while an electrical bias is applied to a substrate. An electrical bias can be a direct current (DC) bias, or can be a low frequency alternating current (AC) bias. In a particular embodiment, a low frequency can be less than 20 kHz. Such a step can include applying a light as in the photo-diffusing step 506 of FIG. 5, or equivalent, and/or applying heat suitable to cause the incorporation of the active material layer into matrix layers.

FIGS. 10C and 10D show a memory cell structure 1000 before and after a step like that of 926. As shown in FIG. 10C, prior to an application of an incorporation energy (e.g., light or heat), a bias can be applied (shown as "V") that establishes a potential (e.g., DC or low frequency) at a substrate (shown at the first electrode layer 1010). With such bias in place, an incorporation energy can be applied, causing active material layer 1030 to be incorporated into matrix layers 1028-A and 1028-B, while under bias. As shown in FIG. 10D, following the application of incorporation energy while under an electrical bias, active material (represented by dots) from layer 1030 can be incorporated into matrix layers 1028-A and 1028-B to form a variable impedance layer 1028'. A variable impedance layer 1028' can have an impedance that is programmable according to the application of an electric field. Incorporating an active material while under an electrical bias can alter the manner by which such a material is incorporated as compared to an unbiased approach. For example, incorporation rates can be increased and/or distributions of active materials within a matrix can vary from approaches that do not bias a substrate.

Method 900 can also include forming a second electrode in contact with the matrix material (step 908). Such a step can occur in the manner described for 508 in FIG. 5, or equivalents.

As in the case of the embodiment shown in FIGS. 5 to 6E, in a particular embodiments, matrix layers 1028-A and 1028-B can include a chalcogenide and/or a transition metal oxide, in a particular $GeS_2$. Further, in some embodiments, an active material layer 1030 can include a silver and/or copper.

Figure 11:
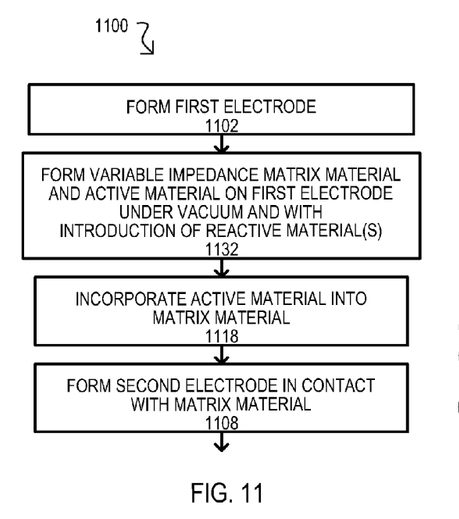
FIG. 11 is a flow diagram of a method of forming a memory cell with deposition and incorporation of an active material occurring under a vacuum and with the introduction of reactive materials, according to an embodiment.
Figure 12A:
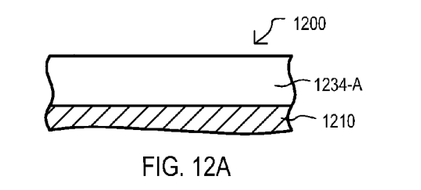
FIGS. 12A to 12E are side cross sectional views showing one example of a method like that of FIG. 11.
Figure 12B:
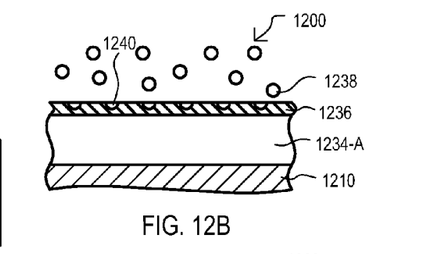
Figure 12C:
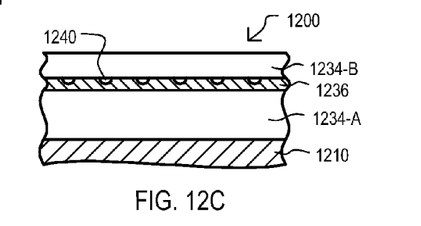
Figure 12D:
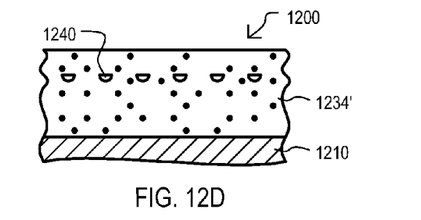
Figure 12E:
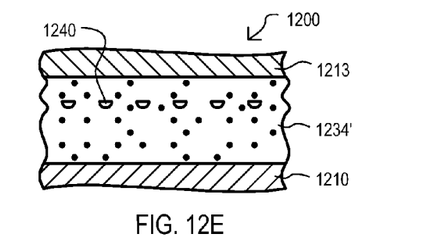

FIGS. 11 to 12E show more examples of a method 1100 and a memory cell structure 1200 according to further embodiments.

A method 1100 can include forming a first electrode (step 1102). Such a step can occur in the manner described for 502 in FIG. 5, or equivalents.

A method 1100 can also include forming a variable impedance matrix material and an active material on a first electrode under a vacuum and with the introduction of one or more reactive materials (step 1132). Such a step can include having a substrate with the first electrode layer in a vacuum, and then forming a matrix material and active layer material without breaking the vacuum environment. At the same time, a reactive material (e.g., gas or liquid) can be introduced as one or more of the layers (e.g., matrix material, or active material layer) is formed.

FIGS. 12A to 12C show one very particular example of a structure during steps like that of 1132. FIG. 12A shows a first electrode layer 1210 having a first matrix layer 1234-A formed thereon. In the embodiment shown, a first matrix layer 1234-A can be deposited under a vacuum. In very particular embodiments, a vacuum can be less than 600 Torr, preferably less than 50 Torr, even more preferably less than $10^{-1}$ Torr.

FIG. 12B shows an active material layer 1236 formed on a first matrix layer 1234-A. An active material layer 1236 can include a material that can be incorporated into first matrix layer 1234-A to vary programmable impedance properties of such a material. Active material layer 1236 can be formed under vacuum with the addition of a reactive material (represented by 1238). A reactive material (e.g., 1238) can react with an active material affecting an active material layer 1236 and/or an interface with such a layer and any adjacent matrix layers (i.e., 1234-A or 1234-B).

As shown in FIG. 12B, introduction of a reactive material (e.g., 1238) can create products (one shown as 840) within an active material layer 1236. As but a few examples, an active material layer 1236 can be metal, including but not limited to Ag or Cu that is deposited by sputtering, and a reactive material can include any of: oxygen ($O_2$), nitrogen ($N_2$), Argon (Ar), or water vapor ($H_2O$).

FIG. 12C shows a second matrix layer 1234-B on active material layer 1236. A second matrix layer 1234-B can be formed from a same material as first matrix layer 1234-A. In the embodiment shown, a second matrix layer 1234-B can be deposited under a vacuum.

Method 1100 also includes incorporating an active material into a matrix material (step 1118). Such a step can include any of those described for step 718 of FIG. 7, or equivalents.

FIG. 12D shows a memory cell structure 1200 after a step like that of 1118. An active material (represented by dots) from layer 1236 can be incorporated into matrix layers 1234-A and 1234-B (represented by dots) to form a variable impedance layer 1234'. A variable impedance layer 1234' can have an impedance that is programmable according to the application of an electric field. Products (e.g., 1240) can vary a rate at which an active material is incorporated into all or a portion of matrix layers (1234-A or 1234-B) as compared to layers without such products. In addition or alternatively, products (e.g., 1240) can vary impedance properties of a resulting variable impedance layer 1234', as compared to such a layer without such products.

Method 1100 can also include forming a second electrode in contact with the matrix material (step 1108). Such a step can occur in the manner described for 508 in FIG. 5, or equivalents.

As in the case of the embodiment shown in FIGS. 5 to 6E, in a particular embodiments, matrix layers 1234-A and 1234-B can include a chalcogenide and/or a transition metal oxide, in particular GeS$_2$. Further, in some embodiments, an active material layer 1236 can include silver and/or copper.

In this way, a memory cell can have a variable impedance layer created by incorporating an active material layer into a matrix material while under a vacuum and with the controlled introduction of one or more reactive species.

Figure 13:
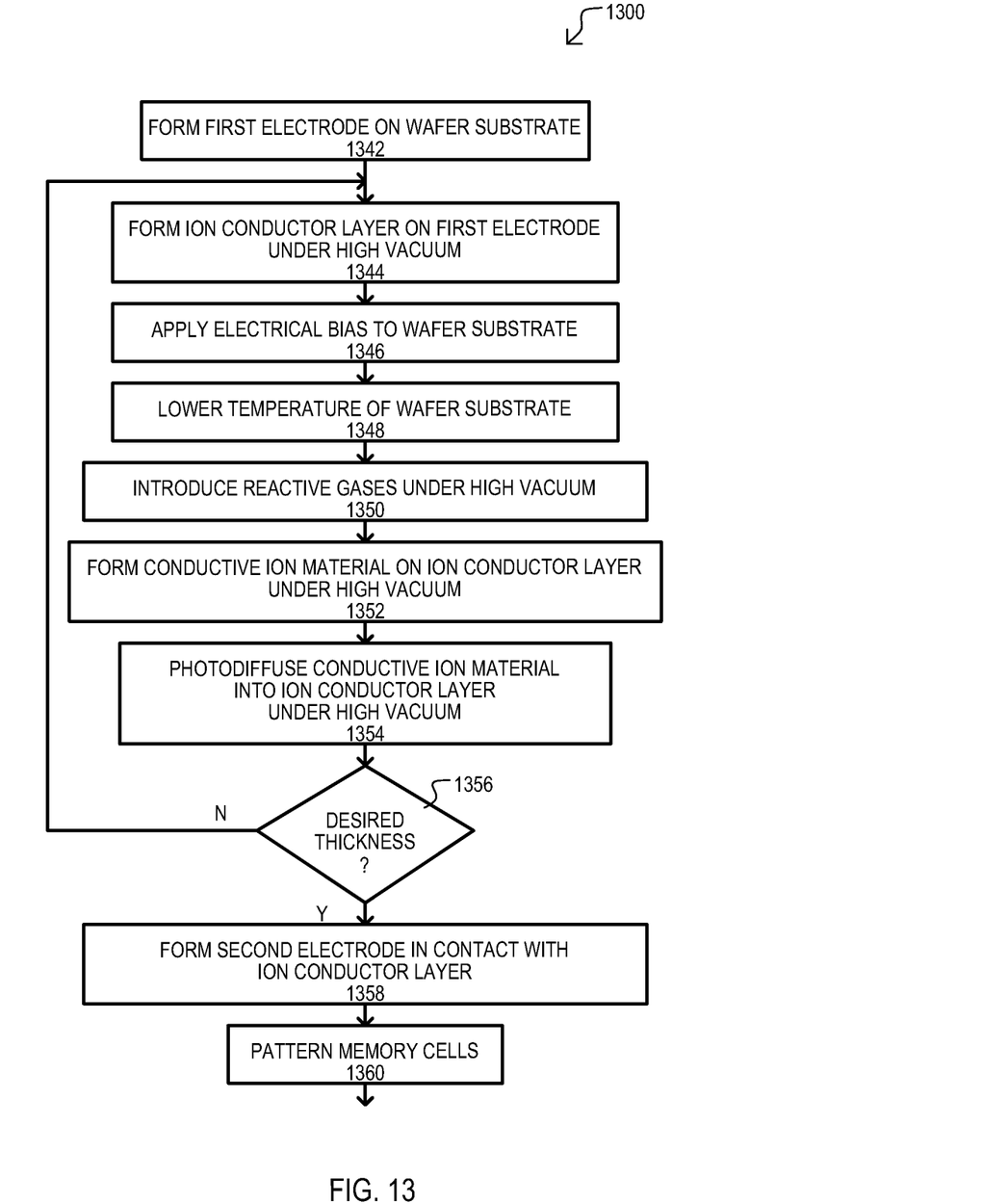
FIG. 13 is a flow diagram of a method of forming memory cells according to an embodiment.

FIG. 13 shows a method 1300 of forming a memory cell structure according to another embodiment in a flow diagram.

A method 1300 can include forming a first electrode on a wafer substrate (step 1342). Such a step can include depositing one or more conductive layers that can be patterned to receive a potential to perform a particular operation on a memory cell (e.g., read, program, erase). In one particular embodiment, such an electrode can be an indifferent electrode.

An ion conductor layer can then be formed on a first electrode under a high vacuum (step 1344). Such a step can include reactive sputtering of one or more targets containing material of an ion conductor layer. In one very particular embodiment, such a step can include sputtering to form a layer of GeS$_2$ while under high vacuum conditions.

An electrical bias can then be applied to a wafer substrate (step 1346). A temperature of substrate can also be lowered (step 1348). A reactive gas can then be introduced under high vacuum (step 1350).

A conductive ion material can then be deposited on an ion conductor layer under a high vacuum (step 1352). Such an action can include reactive sputtering a metal, such as silver, or alternatively copper, to form a layer (which can be contiguous or a discontinuous distribution) of such a material on a surface of the ion conductor layer.

Formation of conductive ion material can differ from conventional approaches, like that of FIGS. 14A to 14E, due to the applied electrical bias, lower temperature, and/or the controlled presence of reactive gases.

A conductive ion material can then be incorporated into an ion conductor layer by application of a light (i.e., "photo-diffused") and under a high vacuum (step 1354). Such a step can include exposing a wafer substrate to ultraviolet and/or visible light without breaking the vacuum used to form the ion conductor layer or conductive ion material.

If a desired thickness has not been achieved (N from 1356), a method 1300 can return to a step 1344.

If a desired thickness has been reached (Y from 1356), a method 1300 can include forming a second electrode in contact with the ion conductor layer 1358. In one embodiment, such a step can include forming an active electrode.

Memory cells can then be patterned (step 1360). Such a step can include patterning deposited layers into multiple programmable metallization cells (PMCs).

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A programmable impedance memory device structure, comprising:
   a multi-layer variable impedance memory element formed on a planar surface of a first barrier layer, the multi-layer variable impedance memory element comprising a plurality of layers substantially parallel to the planar surface throughout the memory element, and including a memory material layer in physical contact with the planar surface of the first barrier layer, the first barrier layer being formed above and in physical contact with a first insulating layer; and
   a second barrier layer formed over the memory element having a top surface substantially parallel with the planar surface of the first barrier layer; wherein
   the first and second barrier layers have lower mobility rates for at least one element within the memory material layer than the first insulating layer, the memory material layer is programmable by application of an electrical field between at least two different impedance states, and the first insulating layer is formed from a different material than the first barrier layer.

2. The memory device of claim 1, wherein
   the first barrier layer is an insulating film.

3. The memory device of claim 2 wherein
   the first barrier layer comprises a material selected from the group of: silicon nitride and silicon oxynitride; and
   the first insulating film comprises silicon dioxide.

4. The memory device of claim 1, wherein
   the second barrier layer is an insulating film.

5. The memory device of claim 4, wherein
   the second barrier layer comprises a material selected from the group of: silicon nitride and silicon oxynitride; and
   the first insulating film comprises silicon dioxide.

6. The memory device of claim 1, wherein
   the multi-layer variable impedance memory element includes
      the memory material comprising an ion conductor layer, and
      an ion source layer formed on the ion conductor layer that includes at least one element ion conductible in the ion conductor.

7. The memory device of claim 1, wherein
   the multi-layer variable impedance memory element includes
      a conductive barrier layer formed over an ion conductor layer, and
      a top conductive interconnect formed over and in contact with the conductive barrier layer, wherein
   the conductive barrier layer is selected to prevent the top conductive interconnect from extending into the ion source layer or ion conductor layer.

8. The memory device of claim 7, wherein
   the conductive barrier layer comprises titanium nitride;
   the ion source layer comprises a metal selected from: silver and copper; and
   the ion conductor layer comprises germanium disulfide.

9. The memory device of claim 8, wherein
the first and second barrier layers comprises a material selected from the group of: silicon nitride and silicon oxynitride;
the ion conductor layer comprises germanium disulfide; and
the first insulating layer comprises silicon dioxide.

10. The memory device of claim 1, further including
a top insulating layer formed over the second barrier layer; and
the first and second barrier layers have lower mobility rates for the at least one element within the memory material layer than the top insulating layer.

11. The memory device of claim 10, wherein
the top insulating layer comprises silicon dioxide.

12. A programmable impedance memory structure, comprising:
a first barrier layer formed over and in physical contact with a first insulating layer and having a top planar surface;
a memory cell structure comprising
a first memory layer comprising a metal oxide that is programmable between at least two different impedance states by application of electrical fields, and formed over and in physical contact with the first barrier layer, and
a second memory layer comprising a conductive material and formed over the first memory layer; and
a second barrier layer formed over the memory cell structure; wherein
the first and second barrier layers are parallel to the top surface of the first barrier layer, and have lower mobility rates for an element of the memory cell structure than the first insulating layer, and the first and second memory layers are substantially parallel to the top planar surface throughout the memory cell structure.

13. The programmable impedance memory structure of claim 12, wherein:
the first barrier layer comprises a material selected from the group of: silicon nitride and silicon oxynitride; and
the second barrier layer comprises a material selected from the group of: silicon nitride and silicon oxynitride.

14. The programmable impedance memory structure of claim 12, wherein:
the first barrier layer comprises a material selected from the group of: silicon nitride and silicon oxynitride;
the second memory layer comprises a material selected from the group of: silver and copper; and
the second barrier layer comprises a material selected from the group of: silicon nitride and silicon oxynitride.

15. The programmable impedance memory structure of claim 12, wherein:
the second memory layer comprises an ion source layer that provides at least one element that is ion conductible in the first memory layer.

16. The programmable impedance memory structure of claim 12, further including:
at least one conductive element formed in the first insulating layer and extending through the first barrier layer to contact the first memory layer.

17. The programmable impedance memory structure of claim 16, wherein:
the conductive element has a top surface that is coplanar with the top surface of the first barrier layer.

18. The programmable impedance memory structure of claim 16, wherein:
the conductive element comprises tungsten.

19. The programmable impedance memory structure of claim 16, further including:
the conductive element has a bottom portion in contact with a lower interconnect pattern.

20. A programmable impedance memory structure, comprising:
a first barrier layer formed over and in physical contact with a first insulating layer and having a top planar surface;
a memory cell structure comprising
a memory layer formed over and in physical contact with the first barrier layer that is programmable between at least two different impedance states by application of electrical fields, and
an ion source layer formed over the memory layer; and
a second barrier layer formed over the memory cell structure; wherein
the first and second barrier layers are parallel to the top surface of the first barrier layer, and have lower mobility rates for an element of the memory cell structure than the first insulating layer, and the memory layer and ion source layer are substantially parallel to the top planar surface throughout the memory cell structure.

21. The programmable impedance memory structure of claim 20, wherein:
the memory comprises a metal oxide.

22. The programmable impedance memory structure of claim 20, wherein:
the ion source layer comprises at least one metal that is ion conductible in the memory layer.

23. The programmable impedance memory structure of claim 20, further including:
the memory cell structure further includes a conductive barrier layer formed over the ion source layer;
an upper insulating layer formed over the conductive barrier layer; and
at least one upper metallization extending through the upper insulating layer and second barrier layer to contact the conductive barrier layer, but not extend through the conductive barrier layer.

24. The programmable impedance memory structure of claim 23, wherein:
the conductive barrier layer comprises titanium nitride.

25. The programmable impedance memory structure of claim 20, further including:
at least one conductive element that extends through the first insulating layer and the first barrier layer to contact the memory layer.

26. The programmable impedance memory structure of claim 25, further including:
an interconnect layer formed below and in contact with the conductive element.

27. The programmable impedance memory structure of claim 26, further including:
conductive contacts formed below and in contact with the interconnect layer, the conductive contacts providing a conductive path to active devices.

* * * * *